United States Patent
Ohya et al.

(10) Patent No.: US 7,889,320 B2
(45) Date of Patent: Feb. 15, 2011

(54) VARIABLE SLIT APPARATUS, ILLUMINATION APPARATUS, EXPOSURE APPARATUS, EXPOSURE METHOD, AND DEVICE FABRICATION METHOD

(75) Inventors: Eizo Ohya, Kumagaya (JP); Kyoji Nakamura, Samukawa-machi (JP); Yasushi Mizuno, Saitama (JP)

(73) Assignee: Nikon Corporation, Tokyo (JP)

( * ) Notice: Subject to any disclaimer, the term of this patent is extended or adjusted under 35 U.S.C. 154(b) by 203 days.

(21) Appl. No.: 11/430,917

(22) Filed: May 10, 2006

(65) Prior Publication Data

US 2007/0014112 A1  Jan. 18, 2007

Related U.S. Application Data

(63) Continuation of application No. PCT/JP2004/016885, filed on Nov. 12, 2004.

(30) Foreign Application Priority Data

Nov. 13, 2003  (JP) .............................. 2003-383880

(51) Int. Cl.
*G03B 27/54* (2006.01)
(52) U.S. Cl. .......................... 355/67; 355/53
(58) Field of Classification Search .................. 355/53, 355/67; 250/205
See application file for complete search history.

(56) References Cited

U.S. PATENT DOCUMENTS

| | | | | |
|---|---|---|---|---|
| 5,473,410 A | * | 12/1995 | Nishi | ........................... 355/53 |
| 5,528,118 A | | 6/1996 | Lee | |
| 5,661,547 A | * | 8/1997 | Aketagawa et al. | ............ 355/53 |
| 5,663,784 A | * | 9/1997 | Tanimoto | ...................... 355/68 |
| 5,874,820 A | | 2/1999 | Lee | |
| 5,895,737 A | | 4/1999 | McCullough et al. | |
| 5,898,477 A | * | 4/1999 | Yoshimura et al. | ............ 355/53 |

(Continued)

FOREIGN PATENT DOCUMENTS

JP        A 4-196513        7/1992

(Continued)

OTHER PUBLICATIONS

Mar. 1, 2005 International Search Report and Written Opinion in International Application No. PCT/JP2004/016885 with English-language translation.

(Continued)

*Primary Examiner*—Hung Henry Nguyen
*Assistant Examiner*—Steven H Whitesell-Gordon
(74) *Attorney, Agent, or Firm*—Oliff & Berridge, PLC

(57) ABSTRACT

The present invention provides a variable slit apparatus, which can rapidly change the shape of the slit width of the illumination light while finely controlling the shape of the slit-shaped illumination light, an illumination apparatus that uses such, an exposure apparatus, and the like. The variable slit apparatus for forming a slit-shaped illumination light comprises: a first light-shielding mechanism that comprises a plurality of blades for defining one long side of the illumination light; a second light-mechanism configured to define another long side of the illumination light; and a drive mechanism that changes the width of the illumination light in the latitudinal direction orthogonal to the longitudinal direction by driving the first light-shielding mechanism and the second light-shielding mechanism.

34 Claims, 6 Drawing Sheets

U.S. PATENT DOCUMENTS

| | | | |
|---|---|---|---|
| 5,898,480 A * | 4/1999 | Ozawa | 355/67 |
| 5,966,202 A | 10/1999 | McCullough | |
| 6,295,119 B1 * | 9/2001 | Suzuki | 355/53 |
| 6,337,162 B1 | 1/2002 | Irie | |
| 6,653,025 B2 | 11/2003 | Nishi | |
| 6,657,725 B1 | 12/2003 | Takahashi | |
| 6,677,088 B2 | 1/2004 | Magome et al. | |
| 6,888,618 B2 * | 5/2005 | Sato | 355/67 |
| 2003/0002021 A1 | 1/2003 | Sato | |

FOREIGN PATENT DOCUMENTS

| | | |
|---|---|---|
| JP | A-07-037774 | 2/1995 |
| JP | A 7-37774 | 2/1995 |
| JP | A-8-166475 | 6/1996 |
| JP | A-8-330224 | 12/1996 |
| JP | A-10-340854 | 12/1998 |
| JP | A-11-194479 | 7/1999 |
| JP | A-11-354425 | 12/1999 |
| JP | A-2000-12453 | 1/2000 |
| JP | A-2000-021764 | 1/2000 |
| JP | A-2000-29202 | 1/2000 |
| JP | A-2000-082655 | 3/2000 |
| JP | A 2000-114164 | 4/2000 |
| JP | A-2000-114164 | 4/2000 |
| JP | A-2000-195786 | 7/2000 |
| WO | WO 99/34255 A1 | 7/1999 |
| WO | WO 99/49504 A1 | 9/1999 |
| WO | WO 99/50712 A1 | 10/1999 |
| WO | WO 99/66370 A1 | 12/1999 |

OTHER PUBLICATIONS

Office Action issued in Japanese Patent Application No. 2005-515468; mailed Feb. 2, 2010; with English-language translation.

Decision of Rejection issued in Japanese Patent Application No. 2005-515468; mailed Jun. 8, 2010; with English-language translation.

* cited by examiner

SHOT REGION

W

SHOT REGION

VARIABLE SLIT APPARATUS, ILLUMINATION APPARATUS, EXPOSURE APPARATUS, EXPOSURE METHOD, AND DEVICE FABRICATION METHOD

CROSS-REFERENCE TO RELATED APPLICATIONS

This is a Continuation Application of International Application No. PCT/JP2004/016885 filed Nov. 12, 2004, which claims priority to 2003-383880 filed Nov. 13, 2003. The contents of the aforementioned applications are incorporated herein by reference.

BACKGROUND OF THE INVENTION

1. Field of the Invention

The present invention relates to an exposure apparatus, which is used in a photolithographic process that manufactures devices like semiconductor devices, as well as to an exposure method and the like.

2. Description of Related Art

In a photolithographic process that manufactures devices, such as semiconductor devices, thin film magnetic heads, and liquid crystal display devices, an exposure apparatus is generally used to transfer an image of a pattern formed on a photomask or a reticle onto a substrate, which is coated with a photosensitive agent, such as a photoresist. As the capacity of semiconductor memory has increased year by year along with the speed and the levels of integration of CPU processors, there has been increasingly greater demand for higher levels of integration and increased fineness of the resist patterns formed on substrates by exposure apparatuses. On the other hand, the increased levels of integration and fineness of the patterns has given rise to an increased defect rate and decreased yield when exposure conditions change even slightly.

Consequently, in an exposure apparatus, defects in the pattern line widths, which become nonuniform due to unevenness in the illuminance, are prevented by uniformizing the cumulative amount of exposure. In particular, within scanning type exposure apparatuses, which relatively scan a mask and a substrate with respect to a slit-shaped illumination light to transfer a pattern formed on the mask onto the substrate, a variable slit apparatus has been proposed that uniformizes the cumulative amount of exposure by changing portions of the slit width of the illumination light, as disclosed in, for example, Japanese Published Unexamined Patent Application No. H10-340854, Japanese Published Unexamined Patent Application No. 2000-82655, and the like.

The technology discussed above changes portions of the slit width of the illumination light by lining up a plurality of blades in the longitudinal direction of the slit-shaped illumination light and linking each blade to an actuator, which is then driven. Furthermore, to precisely eliminate exposure unevenness caused by the illuminance unevenness, it is preferable to finely control the slit width of the illumination light by using numerous blades in order to increase the number of places (positions in the longitudinal direction) at which the slit width can be modified.

Nevertheless, there is a problem in that the increased number of blades commensurately increases the number of actuators, which increases the complexity of controlling the actuators and also decreases the throughput of the exposure apparatus because of the increased time needed to change the shape of the illumination light. In addition, there is a problem in that the heat generated by the increased number of actuators adversely affects the exposure accuracy of the exposure apparatus.

A purpose of some aspects of the present invention is to provide a variable slit apparatus, which can rapidly change the shape of the slit width of the illumination light while finely controlling the shape of the slit-shaped illumination light, an illumination apparatus that uses the same, an exposure apparatus, an exposure method, and a device fabrication method.

SUMMARY

The first aspect of the present invention is a variable slit apparatus for forming a slit-shaped illumination light, comprising: a first light-shielding mechanism configured to comprise a plurality of blades for defining one long side of the illumination light; a second light-mechanism configured to define another long side of the illumination light; and a drive mechanism configured to drive at least one of the first light-shielding mechanism and the second light-shielding mechanism and changes the shape of the illumination light in the longitudinal direction. According to this aspect of the invention, the second light-shielding mechanism has a substantially linear light-shielding mechanism, and therefore can easily and rapidly correct the low order unevenness component of the illumination light. Furthermore, the first light-shielding mechanism can correct the high order unevenness component of the illumination light.

In addition, each of the plurality of blades comprises a linear edge part, and the first light-shielding mechanism comprises a first push-and-pull member that pushes and pulls the plurality of blades in a direction substantially orthogonal to one long side of the illumination light, and it is therefore possible to finely change the shape of the illumination light in the longitudinal direction.

In addition, because the plurality of blades is pectinately disposed with substantially no gaps therebetween, it is possible to shield the illumination light with no leakage of light.

In addition, the second light-shielding mechanism comprises one blade, which comprises a linear edge part, and a second push-and-pull member that pushes and pulls both ends of the blade, the drive mechanism inclines the linear edge part of the one blade from a prescribed position via the second push-and-pull member, and it is therefore possible to rapidly correct the low order unevenness component of the illumination light because the second light-shielding mechanism can be driven with a simple constitution.

In addition, the drive mechanism drives the first light-shielding mechanism and the second light-shielding mechanism based on information related to a illuminance unevenness of the illumination light, and it is therefore possible to precisely correct the illuminance unevenness of the illumination light.

The second aspect of the present invention is an illumination apparatus that irradiates an object to be illuminated with a slit-shaped illumination light, wherein a variable slit apparatus according to the first aspect of the present invention is used as an apparatus that adjusts the shape of the illumination light. According to this aspect of the present invention, if illuminance unevenness is generated in the substantially rectangular illumination light, then it is possible to precisely correct the illuminance unevenness by rapidly changing the slit width in accordance with that illuminance.

The third aspect of the present invention is an exposure apparatus that exposes a pattern, which is formed in a mask, upon a substrate by performing relative scanning of the mask and the substrate in a direction substantially orthogonal to the longitudinal direction of an illumination light, which is formed in a slit shape, while irradiating the substrate with the illumination light via the mask, wherein an illumination apparatus according to the second aspect of the present invention is used as the illumination apparatus that irradiates the mask with the illumination light. According to this aspect of the present invention, the exposure unevenness is rapidly and precisely corrected, which uniformizes the widths of the lines formed on the substrate and makes it possible to reduce the incidents of line width defects.

In addition, an exposure apparatus comprises: a measuring unit that measures information related to a illuminance unevenness of the illumination light; a calculation unit that determines the shape of either one long side or the other long side of the illumination light based on information related to the illuminance unevenness so that the illuminance of the illumination light in the direction substantially orthogonal during the relative motion is substantially uniform on a cumulative basis; and a control unit that provides the drive mechanism with a drive command based on a calculation result of the calculation unit to drive the first light-shielding mechanism and the second light-shielding mechanism, and it is therefore possible to correct unevenness in the cumulative illumination exposure.

In addition, the calculation unit differentiates and calculates a low order unevenness component and a high order unevenness component of the second order or higher in the illuminance distribution of the illumination light in the long side direction; in addition, the control unit provides the drive mechanism with a drive command to drive the first light-shielding mechanism based on the high order unevenness component and provides the drive mechanism with a drive command to drive the second light-shielding mechanism based on the low order unevenness component, and it is therefore possible to precisely correct first order and high order unevenness in the illuminance unevenness.

Furthermore, an exposure apparatus comprises: the calculation unit that determines the shape of the other long side of the illumination light based on information related to a line width of the pattern formed on the substrate; and the control unit that provides the drive mechanism with a drive command based on a calculation result of the calculation unit to drive the second light-shielding mechanism.

The fourth aspect of the present invention is an exposure method, comprising: performing relative scanning of a mask having a pattern and a substrate in a direction substantially orthogonal to the longitudinal direction of a slit-shaped illumination light while irradiating the substrate with the illumination light via the mask, comprising: changing the shape of the illumination light in the longitudinal direction by driving the first light-shielding mechanism, which comprises a plurality of blades for defining one long side of the illumination light, and a second light-shielding mechanism, which defines another long side of the illumination light. According to this aspect of the invention, the second light-shielding mechanism has a substantially linear light-shielding mechanism, the same as the third aspect of the invention, and the second light-shielding mechanism can therefore easily and rapidly correct the low order unevenness component of the illumination light. Furthermore, the first light-shielding mechanism can correct the high order unevenness of the illumination light.

The fifth aspect of the present invention is a device fabrication method that includes a lithographic process, comprising: using an exposure method according to the fourth aspect of the present invention in the lithographic process. According to this aspect of the present invention, defects in the line widths of the pattern caused by illuminance unevenness are suppressed, and it is therefore possible to efficiently manufacture devices that comprise a fine pattern.

According to the present invention, the following effects can be obtained.

In the first aspect of the present invention, the low order unevenness component and the high order unevenness component are each corrected with different light-shielding mechanisms, and it is therefore possible to precisely correct illuminance unevenness without complicating the control of the plurality of light-shielding mechanisms.

In addition, it is possible to precisely correct the high order unevenness component of the illumination light by finely changing the shape of the illumination light in the longitudinal direction. The shape of the illumination light in the longitudinal direction can be precisely changed by shielding the illumination light, without any leakage of light. Because the low order unevenness component of the illumination light can be corrected rapidly, throughput is not reduced when using the exposure apparatus. Because the illuminance unevenness of the illumination light can be precisely corrected, a fine pattern can be formed when using the exposure apparatus.

According to the second aspect of the present invention, particularly if a low order unevenness component is generated in the illumination light, then that illuminance unevenness can be rapidly and easily corrected.

According to the third and fourth aspects of the present invention, exposure unevenness is rapidly and precisely corrected, which uniformizes the line widths formed on the substrate, and it is therefore possible to reduce the incidence of line width defects as well as to improve throughput. These aspects of the present invention are particularly effective when forming fine patterns.

In addition, the cumulative unevenness of the illuminance of the illumination light is precisely corrected, and it is therefore possible to reliably reduce the incidence of defects in the line widths of a pattern formed on a substrate.

In addition, the low order unevenness component and the high order unevenness component of the illuminance unevenness are reliably corrected, and it is therefore possible to uniformize the line widths of the pattern formed on the substrate.

According to the fourth aspect of the present invention, defects in the line width of the pattern caused by illuminance unevenness are suppressed, and it is therefore possible to efficiently fabricate devices that comprise fine patterns. Furthermore, it is possible to efficiently achieve increased memory capacity of semiconductor memory, as well as increased speed and higher levels of integration of a CPU processor.

DETAILED DESCRIPTION OF THE INVENTION

Figure 1:
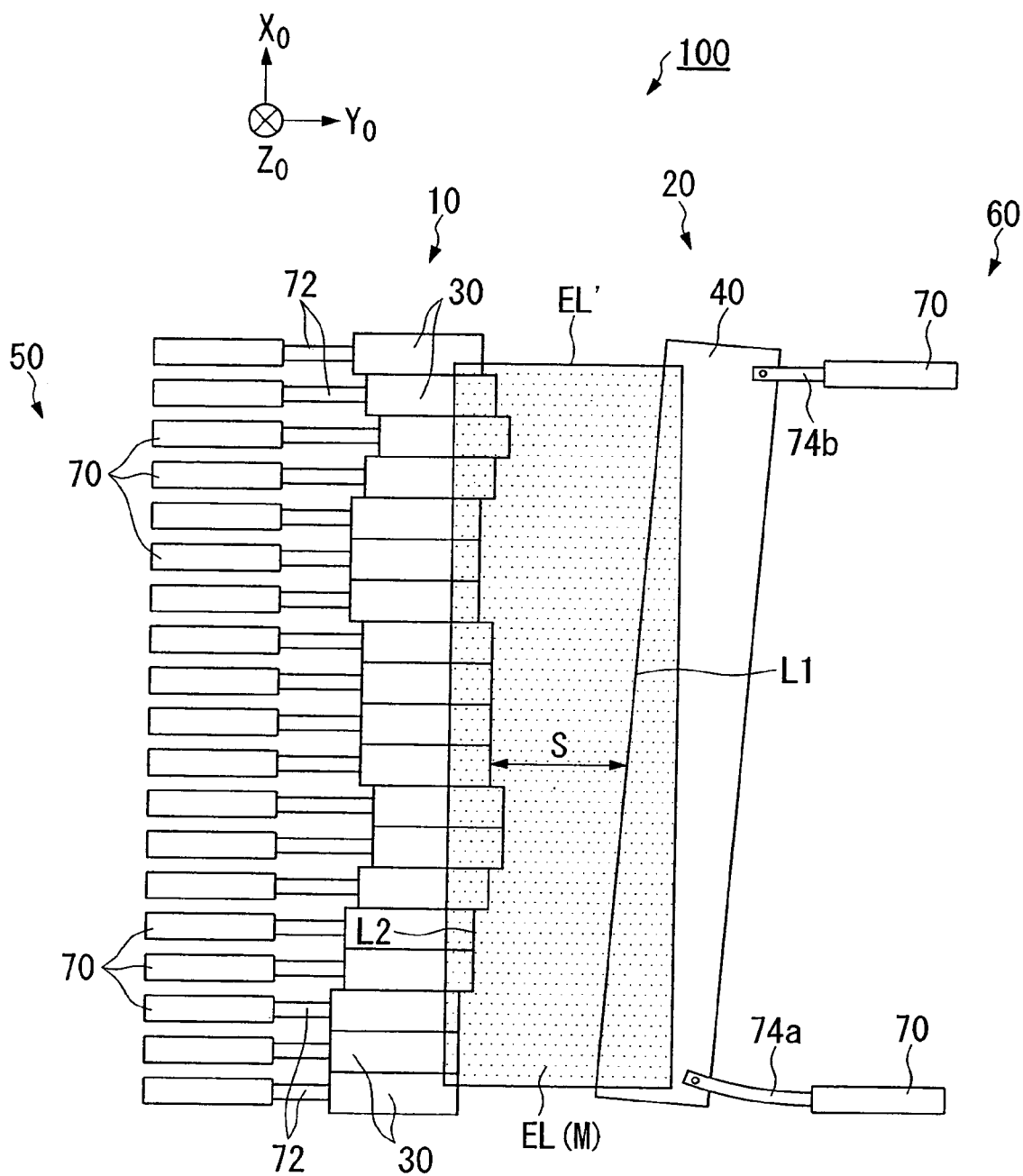
FIG. 1 shows a variable slit apparatus.

The following explains an embodiment of a variable slit apparatus of the present invention, referencing the drawings. FIG. 1 shows a variable slit apparatus 100.

First, an illumination light emitted from a light source (not shown) passes through a shaping optical system, and then is shaped into a rectangular illumination light EL'.

Furthermore, the variable slit apparatus 100 modifies the width of the rectangularly shaped illumination light EL' in a direction (hereinafter called the latitudinal direction) substantially orthogonal to the longitudinal direction, and thereby forms a slit-shaped illumination light EL that has the desired slit width. The variable slit apparatus 100 comprises: a first light-shielding mechanism 10, which shields part of the illumination light EL that passes through the variable slit apparatus 100, for the purpose of defining one long side L2 of the slit-shaped illumination light EL; a second light-shielding mechanism 20, which shields part of the illumination light EL that passes through the variable slit apparatus 100, for the purpose of defining the other long side L1 of the slit-shaped illumination light EL; an actuator unit 50 that drives the first light-shielding mechanism 10; and an actuator unit 60 that drives the second light-shielding mechanism 20. Namely, by driving the actuator units 50 and 60, the variable slit apparatus 100 shields the illumination light EL that passes therethrough as desired, and changes portions of the width of the illumination light EL, which passes through an aperture M between the first light-shielding mechanism 10 and the second light-shielding mechanism 20, in the latitudinal direction.

Accordingly, the slit-shaped illumination light EL, wherein portions of the slit width S are changed, is formed by the first light-shielding mechanism 10 and the second light-shielding mechanism 20. Furthermore, both short sides of the illumination light EL are defined by two blades (not shown).

The latitudinal direction of the illumination light EL is assumed to be the $Y_0$ direction, and the longitudinal direction of the illumination light EL is assumed to be the $X_0$ direction.

The first light-shielding mechanism 10 has a plurality of blades 30, which are independently driven. These blades 30 are disposed within a plane orthogonal to the optical axis of the illumination light EL, and are pectinately disposed within that plane without any gaps therebetween.

Each of the blades 30 is formed in a long plate shape with its longitudinal direction disposed parallel to the $Y_0$ direction. In addition, because each of the blades 30 is heated by the illumination light EL, it is formed with a heat resistant material, e.g., a metal such as stainless steel, iron, or a copper alloy. Furthermore, each of the blades 30 is surface treated so that it can slide while making contact with its adjacent blades 30.

In addition, a linear edge part is formed at one end of each blade 30 in the longitudinal direction, and these edge parts define one long side L2 of the slit-shaped illumination light EL and are formed parallel to the $X_0$ direction. In addition, each of the edge parts is formed with a thickness of approximately 10 μm. This arrangement is in order to accurately align the edge parts with the position in the optical axis direction ($Z_0$ direction) at which the slit-shaped illumination light EL is to be blocked.

Furthermore, the other end of each blade 30 in the longitudinal direction is linked to a linear actuator 70, which is discussed later, via a rod 72. Accordingly, each of the blades 30 is moved in the $Y_0$ direction to define one long side L2 of the illumination light EL by moving the corresponding rod 72 by just an arbitrary distance in the latitudinal direction ($Y_0$ direction) of the illumination light EL.

The second light-shielding mechanism 20 comprises one long plate-shaped blade 40, the longitudinal direction of which is disposed parallel to the $X_0$ direction. FIG. 1 shows a state wherein the blade 40 has transitioned from the initial state, wherein its longitudinal direction is disposed parallel to the $X_0$ direction, to a prescribed angularly inclined state.

The blade 40 is made of the same material as the blades 30, and its edge part on the illumination light EL side is formed linearly and with a thickness of approximately 10 μm.

Furthermore, rods 74a and 74b, which are rotationally linked to both ends of the blade 40 in the longitudinal direction, and the linear actuators 70, which move the rods 74a and 74b by just an arbitrary distance in the latitudinal direction ($Y_0$ direction) of the illumination light EL, are linked. Moving the two rods 74a and 74b by just an arbitrary distance in the latitudinal direction ($Y_0$ direction) of the illumination light EL makes it possible to incline the blade 40 with respect to its initial state so that its edge part is within a plane substantially orthogonal to the optical axis of the illumination light EL. Namely, by rotating the rod 74a, which is rotationally linked to the blade 40, about its rotary shaft, or by rotating the rod 74b, which is rotationally linked to the blade 40, about its rotary shaft, the edge part of the blade 40 can change the light shielded state of the illumination light EL that passes through the variable slit apparatus 100, and the illumination light EL can thereby be formed into an arbitrary slit shape.

The actuator unit (drive mechanism) 50 comprises linear actuators 70 equal in number to the blades 30, and rods (first push-and-pull members) 72 that are each linked to a linear actuator; in addition, each blade 30 is moved in the $Y_0$ direction via the corresponding rod 72 by driving the corresponding linear actuator 70, as discussed earlier. For example, voice coil motors and the like can be used as the linear actuators.

In addition, the actuator unit (drive mechanism) 60 comprises two linear actuators 70 and rods (second push-and-pull members) 74a, 74b, which are linked to the two linear actuators, and the blade 40 is moved parallel to the $Y_0$ direction and rotated via the rods 74 by driving each of the linear actuators 70, as discussed above. The rod 74a of the two rods 74a and 74b comprises an elastic body (e.g., a leaf spring and the like), which is elastically deformable in the $X_0$ direction, and a tip of the rod 74a, i.e., the part that links with the blade 40, can be finely moved in the $X_0$ direction. Thus, the tip portion of the rod 74a is constituted so that it is finely movable in the $X_0$ direction because the blade 40 moves rotationally. In other words, if the blade 40 is rotated, then both ends thereof, which are linked to the linear actuators 70, also move finely in the $X_0$ direction while moving in the $Y_0$ direction, and it is therefore necessary to constitute the rod 74a so that it can be displaced in the $X_0$ direction. The other rod 74b forms the origin of the movement of the blade 40 in the $X_0$ direction and is rigid enough so that it does not bend in the $X_0$ direction, i.e., so that it does not bend when the blade 40 moves in the $Y_0$ direction.

The actuator units 50 and 60 are attached to a movable platform (not shown), which is movable in the $Y_0$ direction, and each of the blades 30, 40 can be moved in the $Y_0$ direction together with the actuator units 50 and 60.

Figure 2:
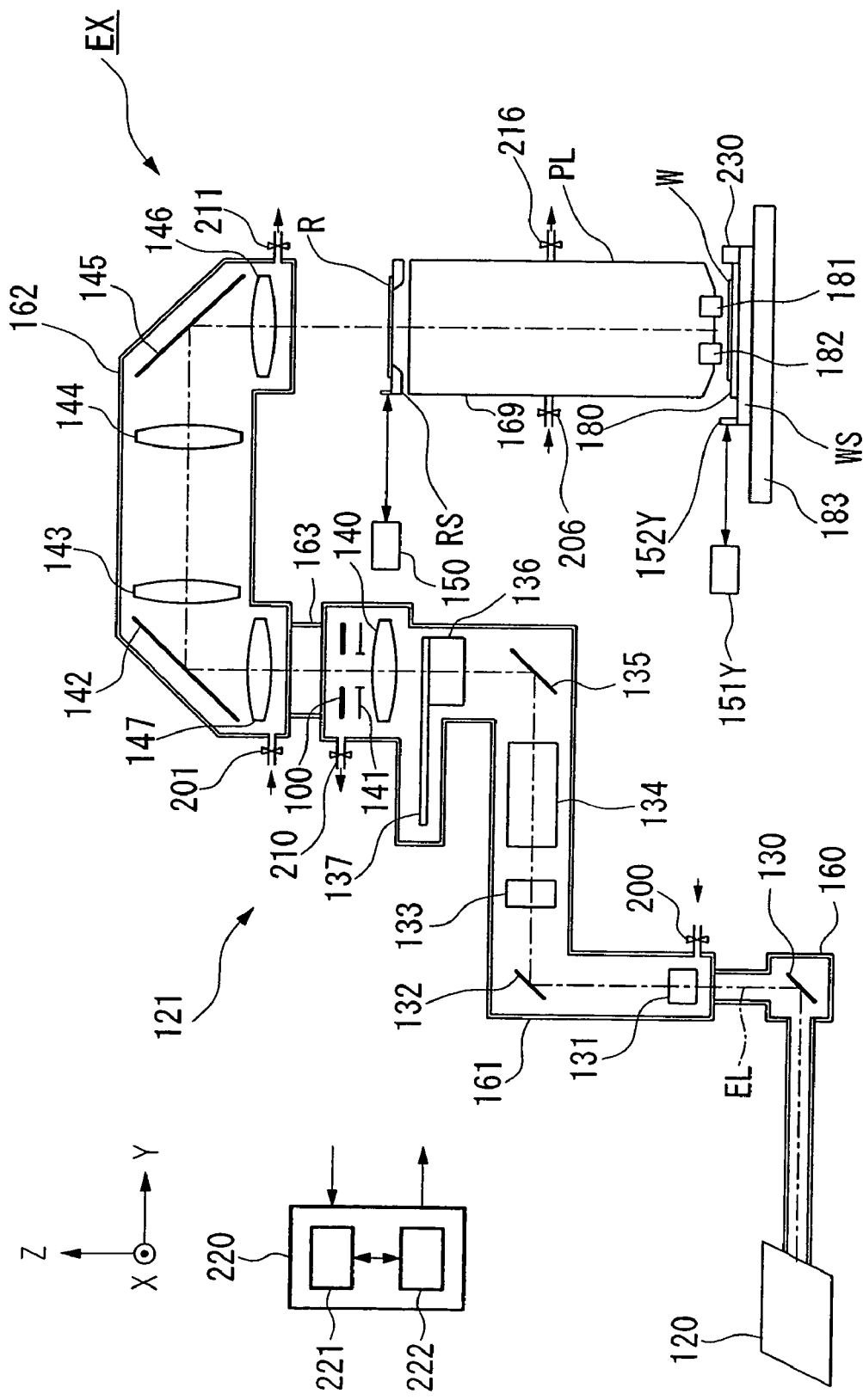
FIG. 2 is a schematic diagram that shows an illumination optical system and an exposure.

The following explains an embodiment wherein the variable slit apparatus 100 discussed above is adapted to an illumination apparatus and an exposure apparatus. FIG. 2 is a schematic diagram that shows an illumination optical system 121 and an exposure apparatus EX. The present embodiment explains the illumination apparatus taking the illumination optical system 121 as an example.

The exposure apparatus EX is a step-and-scan system scanning type exposure apparatus, i.e., a so-called scanning stepper, that transfers a pattern (circuit pattern and the like) formed on a reticle R onto a wafer W through a projection optical system PL by synchronously moving the reticle R and the wafer (substrate) W with relative motion in a one dimensional direction while irradiating the reticle (mask) R with the illumination light (exposure light) EL. The exposure apparatus EX can expose the pattern of the reticle R onto an area of the wafer W that is larger than the exposure field of the projection optical system PL.

The exposure apparatus EX comprises a light source 120, the illumination optical system 121 that irradiates the reticle R with the illumination light EL from the light source 120, a reticle stage RS that holds the reticle R, the projection optical system PL that irradiates the illumination light EL existing from the reticle R upon the wafer W, a wafer stage WS that holds the wafer W, a main control system 220 that provides overall control of the operation of the exposure apparatus EX, and the like. The entire exposure apparatus EX is housed inside a chamber (not shown).

The X axis and the Y axis in the XYZ orthogonal coordinate system are set so that they are parallel to the wafer stage WS, which holds the wafer W, and the Z axis is set to a direction orthogonal to the wafer stage WS. In fact, the XY plane in the XYZ orthogonal coordinate system shown in the figure is set to a plane parallel to the horizontal plane, and the Z axis is set to the vertical direction.

A light source 120 can be used that generates illumination light in a wavelength band of approximately 120 nm to 200 nm, e.g., an ArF excimer laser (193 nm wavelength), a fluorine ($F_2$) laser (157 nm wavelength), a krypton ($Kr_2$) laser (146 nm wavelength), an argon ($Ar_2$) laser (126 nm wavelength), and the like. An ArF excimer laser is used as the illumination light in the present embodiment.

In addition, a light source control unit (not shown) is provided together with the light source 120, and this light source control unit controls the oscillation center wavelength and the full width at half maximum of the emitted illumination light EL in accordance with an instruction from the main control system 220, controls the trigger of the pulse oscillator, and the like.

The illumination optical system 121 irradiates the illumination light EL irradiated from the light source 120 to a prescribed illumination area on the reticle R with a substantially uniform illuminance distribution.

Specifically, the illumination light EL irradiated from the light source 120 is polarized by a deflecting mirror 130, and then enters a variable dimmer 131, which functions as an optical attenuator. To control the amount of exposure upon the photoresist on the wafer, the variable dimmer 131 can regulate the dimming ratio continuously or in graduated steps. The illumination light EL that emerges from the variable dimmer 131 is polarized by an optical path deflecting mirror 132, and then enters a second fly-eye lens 136 via a first fly-eye lens 133, a zoom lens 134, a vibrating mirror 135, and the like, in that order.

A revolver 137 is disposed on the exist side of the second fly-eye lens 136 that is used to switch the aperture stop in order to set the effective size and shape of the light source as desired. In the present embodiment, the size of the light beam from the zoom lens 134 to the second fly-eye lens 136 can be varied in order to reduce losses in the amount of light at the aperture stop.

The revolver 137 is provided with substantially equispaced aperture stops, e.g., an aperture stop (normal stop) that comprises a normal circular aperture; an aperture stop (small σ stop) that comprises a small circular aperture in order to reduce the σ value, which is the coherence factor; an annular aperture stop (annular stop) for annular illumination; and a modified aperture stop, wherein a plurality of apertures for a modified light source are eccentrically disposed. This revolver 137 is rotated by a drive apparatus, such as a motor, that selectively disposes any one of the aperture stops in the optical path of the illumination light EL, and the shape and size of a secondary light source at the pupil plane is thereby controlled so that it is annular, a small circle, a large circle, a quadrupole, or the like. Thus, the illumination conditions of the reticle R can be modified by disposing anyone of the stops in the optical path of the illumination light EL.

Furthermore, the illumination light EL that passes through the aperture of the aperture stop illuminates an illumination field stop (reticle blind) 141 through a condenser lens group 140. The illumination field stop 141 is disclosed in Japanese Published Unexamined Patent Application No. H4-196513 and the corresponding U.S. Pat. No. 5,473,410.

In addition, the variable slit apparatus 100 is disposed in the vicinity of the illumination field stop 141. In detail, the first light-shielding mechanism 10 and the second light-shielding mechanism 20, which constitute the variable slit apparatus 100, are disposed at a position conjugate to the pattern of the reticle R (precisely speaking, in the vicinity of the conjugate position), as shown in FIG. 2, and vary the slit width S of the illumination light EL. In addition, the first light-shielding mechanism 10 and the second light-shielding mechanism 20 can be displaced in the direction of the optical axis of the illumination optical system 121. When changing the slit width S of the variable slit apparatus 100, it is possible to change the slit width S of the illumination light EL, which is irradiated upon the reticle R and the wafer W, in the scanning direction (Y direction), and it is also possible to adjust the blur width of the circumferential edge portion of the illumination light EL irradiated upon the reticle R and the wafer W by moving the first light-shielding mechanism 10 and the second light-shielding mechanism 20 in the direction of the optical axis of the illumination optical system 121.

Furthermore, the illumination light EL that passes through the illumination field stop 141 and the variable slit apparatus 100 is guided onto the reticle R through an illumination field stop image forming optical system (reticle blind image forming system), which comprises deflecting mirrors 142, 145 and lens groups 143, 144, 146, and 147.

Thereby, an illumination area (exposure field) that is the same shape as the aperture M of the variable slit apparatus 100 is formed on the reticle R.

The reticle stage RS is provided directly below the illumination optical system 121, and comprises a reticle holder, which holds the reticle R, and the like. The reticle holder (not shown) is supported by the reticle stage RS, has an aperture that corresponds to the pattern on the reticle R, and holds the reticle R by vacuum chuck with the pattern face down. The reticle stage RS is moved by a drive unit (not shown) so that it is scanned in one dimension, i.e., the Y direction, and is further capable of fine movement in the X direction and in the rotational direction (θ direction about the Z axis). A linear coil motor, for example, is used as the drive unit. Thereby, the drive unit is constituted so that it is capable of positioning the reticle R so that the center of a pattern area thereof passes through the optical axis of the projection optical system PL.

Furthermore, a laser interferometer 150 sequentially detects the position of the reticle R in the Y direction and outputs it to the main control system 220.

The projection optical system PL is provided directly below the reticle stage RS and seals a plurality of dioptric elements, which are made of a fluoride crystal such as fluorine doped quartz, fluorite, or lithium fluoride, with a projection system housing (a lens barrel 169). The projection optical system PL reduces the illumination light EL that exists through the reticle R with a prescribed projection magnification β (where β is, for example., ¼), and forms an image of the pattern of the reticle R on a specified area (shot region) on the wafer W. The optical elements, which constitute the projection optical system PL, are supported by the project system housing via holding members (not shown), which each holds the circumferential edge part of its respective optical element.

Furthermore, if vacuum ultraviolet rays, such as from an $F_2$ laser, are used as the illumination light EL, then fluorite (crystal $CaF_2$), quartz glass doped with fluorine and hydrogen, for example, as well as magnesium fluoride ($MgF_2$), and the like, is used as the optical glass material that has a satisfactory transmittance. In this case, by constituting the projection optical system PL with just dioptric elements, it is difficult to obtain the desired image forming characteristics (chromatic aberration characteristics and the like), and therefore a catadioptric system, which combines dioptric elements with catoptric elements (reflecting mirrors), may be adopted.

The wafer stage WS comprises a wafer holder 180, which holds the wafer W, and the like. The wafer holder 180 is supported by the wafer stage WS and holds the wafer W by a vacuum chuck. The wafer stage WS comprises a pair of blocks, which are movable in mutually orthogonal directions, that are overlapped on a base plate 183 and can be moved within the XY plane by a drive part (not shown).

Furthermore, an externally provided laser interferometer 151 sequentially detects the position of the wafer stage WS in the X direction and the Y direction, and outputs it to the main control system 220. A Y movable mirror 152Y, which comprises a planar mirror, is provided to the end portion on the –Y side of the wafer stage WS and extends in the X direction. A length measuring beam is projected from a Y axis interferometer 151Y, which is disposed externally and substantially perpendicular to the Y movable mirror 152Y, and the Y position of the wafer W is detected by the reception of the reflected light of that length measuring beam by the Y axis interferometer 151Y. In addition, the X position of the wafer W is detected by an X axis laser interferometer (not shown), which is constituted substantially the same.

Furthermore, the image of the pattern of the reticle R is projected and transferred onto the wafer W by positioning an arbitrary shot region on the wafer W at the projection position (exposure position) of the pattern of the reticle R by moving the wafer stage WS within the XY plane.

In addition, the wafer stage WS is levitationally supported on the floor surface via a counterweight (not shown) and a plurality of air pads (not shown), which are noncontact bearings. Consequently, the counterweight moves in the –X direction and the –Y direction by the law of conservation of momentum in accordance with, for example, the movement of the wafer stage WS in the +X direction and the +Y direction. Thus, the movement of the counterweight offsets the reaction force attendant with the movement of the wafer stage WS, and also prevents a change in the center of gravity.

Furthermore, an oblique incidence type auto-focus sensor 181, an off axis type alignment sensor 182, and the like are provided above the wafer stage WS in order to detect the Z direction position (focus position), the inclination angle, and the like of the front surface of the wafer W.

Furthermore, the main control system (control unit) 220 provides overall control of the exposure apparatus EX and is provided with a calculation unit 221, which performs various calculations, as well as a storage unit 222 that stores various information.

The exposure operation, wherein the positions, for example, of the reticle stage RS and the wafer stage WS are controlled and the image of the pattern formed in the reticle R is transferred to a shot region on the wafer W, is performed repetitively.

In addition, the cumulative amount of exposure is also uniformized by instructing the actuator units 50 and 60 of the variable slit apparatus 100 to control the shape and position of the light-shielding mechanisms 10 and 20.

Incidentally, because the illumination light EL, i.e., the ArF excimer laser light, is adversely affected by the absorption thereof by, for example, oxygen molecules and organic substances (hereinafter, referred to as light absorbing substances), it is necessary to reduce the light absorbing substances present in the space through which the illumination light EL passes in order to ensure that the illumination light EL reaches the upper surface of the wafer W with a sufficient illuminance.

Consequently, the space through which the illumination light EL passes, i.e., the illumination optical path (the optical path from the light source 120 to the reticle R) and the projection optical path (the optical path from the reticle R to the wafer W), is isolated from the external atmosphere, and those optical paths are filled with a low light absorbing gas (e.g., an inert gas, such as nitrogen, helium, argon, neon, krypton, or a mixture thereof) that has low absorptivity characteristics with respect to the vacuum ultraviolet region light.

Specifically, a casing 160 is provided to the optical path from the light source 120 to the variable dimmer 131, a casing 161 is provided to the optical path from the variable dimmer 131 to the illumination field stop 141, and a casing 162 is provided to the illumination field stop image forming optical system from the lens group 143 to the lens group 147; in addition, these casings are isolated from the external atmosphere and the optical paths are filled with the low light absorbing gas. The casing 161 and the casing 162 are connected by a casing 163.

The reticle stage RS, which holds the reticle R, is provided in the space between the projection optical system PL and the casing 162, which houses the illumination field stop image forming optical system.

In addition, the lens barrel 169 of the projection optical system PL is a casing, and the internal optical path thereof is filled with the low light absorbing gas.

Furthermore, the image plane side of the projection optical system PL is provided with: the wafer stage WS, which holds the wafer W via the wafer holder 180; the oblique incidence type auto-focus sensor 181 for detecting the Z direction position (focus position) and the inclination angle of the front surface of the wafer W; the off axis type alignment sensor 182; the base plate 183, whereon the wafer stage WS is mounted; and the like.

Moreover, air supply valves 200, 201, and 206 and air exhaust valves 210, 211, and 216 are provided to the casings 161 and 162 and the lens barrel 169, and these air supply valves 200, 201, and 206 and air exhaust valves 210, 211, and 216 are connected to a gas supply and exhaust system (not shown), supply the low light absorbing gas into each of the spaces, and externally exhaust, for example, the light absorbing substances.

Continuing, the following explains a method of performing an exposure process by using the variable slit apparatus 100, which is constituted as described above, the illumination optical system 121, and the exposure apparatus EX to transfer the pattern formed in the reticle R onto the wafer W.

First, the reticle R and the wafer W are mounted on the reticle stage RS and the wafer stage WS, respectively, and the illumination light EL from the illumination optical system 121 is irradiated upon the reticle R. The light from the illumination area on the reticle R is guided onto the wafer W through the projection optical system PL, and the pattern inside the illumination area of the reticle R is thereby reduction projected onto the wafer W.

Furthermore, the reticle R and the wafer W are synchronously moved with relative motion in opposite directions along the direction of the slit width S of the illumination light EL while irradiating the reticle R with the slit-shaped illumination light EL, and the pattern formed in the reticle R is thereby transferred onto the wafer W through the projection optical system PL. By repetitively performing such an exposure procedure, the pattern formed in the reticle R is successively exposed onto each shot region of the wafer W.

If the illumination of the illumination light EL, which is irradiated upon the reticle R, is uneven at this time, then the cumulative amount of exposure will become nonuniform, as will the line widths of the pattern formed on the wafer W. Because the nonuniformity of the line widths will cause defects, such as an open circuit, in the semiconductor device, it is necessary to uniformize the cumulative amount of exposure from the illumination light EL. Such illuminance unevenness is thought to be generated due to, for example, changes in the transmittance of the optical elements that constitute the illumination optical system 121 and the projection optical system PL.

The following discusses the principle of correcting exposure unevenness caused by illuminance unevenness. FIG. 3A to 3H explain the illuminance unevenness and the like of the illumination light, wherein FIG. 3A to 3D show modes of illuminance unevenness (distribution) and FIG. 3E to 3H show the shape of the aperture M of the variable slit apparatus 100, i.e., the shape of the area, which is formed by the light-shielding mechanisms 10 and 20, through which the illumination light EL passes, in order to correct these various illuminance unevenness modes.

The illumination light EL is normally formed in a slit shape and irradiates the wafer W through the reticle R, thereby forming the slit-shaped illumination area on the wafer W. Furthermore, by scanning the reticle R and the wafer W in the slit width S direction of the illumination light EL, the pattern of the reticle R is transferred to a rectangular shot region formed on the wafer W. At this time, if the illuminance of the illumination light EL is uniform and the scanning speed is constant, then the cumulative amount of exposure of the illumination light will become uniform in the direction orthogonal to the scanning direction, and the shot region on the wafer W can be expected to be uniformly exposed.

Figure 3A:
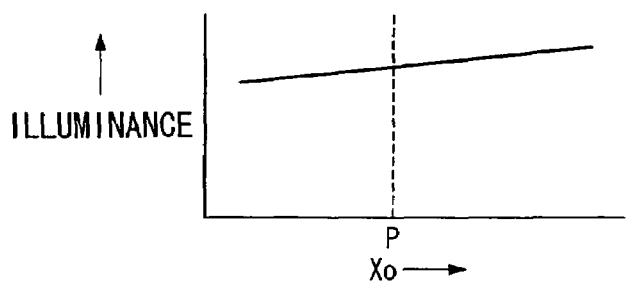
FIG. 3A illustrates the illuminance unevenness of the illumination light.

Nevertheless, there are actually many cases wherein the illuminance of the illumination light EL is nonuniform, e.g., states arise wherein the illuminance of the illumination light EL with respect to a center P of the slit-shaped illumination area is higher than an appropriate value on the right side and lower than the appropriate value on the left side ($-X_0$ side), as shown in FIG. 3A. Furthermore, if the exposure process is performed with such nonuniform illumination light EL, then the right side of the shot region becomes what is called overexposed, and the left side becomes underexposed. As a result, the exposure of the photosensitive agent (photoresist) becomes nonuniform and the line widths formed on the wafer W becomes nonuniform.

Accordingly, the need arises to correct the nonuniformity of the illuminance of the illumination light EL, as was discussed above. One method of correction is to reduce the area upon which the illumination light EL is irradiated in order to reduce the amount of exposure at places where the illuminance is higher than the appropriate value (overexposed). Namely, part of the slit width S is decreased. Conversely, at places where the illuminance is lower than the appropriate value (underexposed), the area whereupon the illumination light EL is irradiated is increased in order to increase the amount of exposure. Namely, part of the slit width S is increased. In other words, the variable slit apparatus 100 adjusts part of the slit width S so that the cumulative amount of exposure of the illumination light is substantially uniformized in the direction orthogonal to the scanning direction.

Figure 3E:
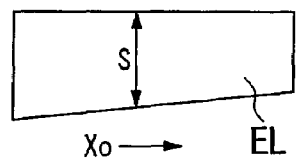
FIG. 3E illustrates the illuminance unevenness of the illumination light.
Figure 3B:
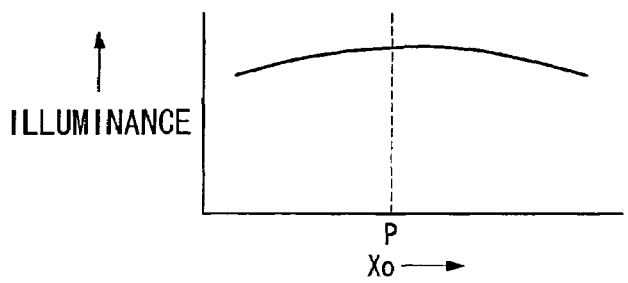
FIG. 3B illustrates the illuminance unevenness of the illumination light.

With reference to the example discussed above, if nonuniformity in the illuminance of the illumination light EL arises, as shown in FIG. 3A, then the right side slit width S is decreased, as shown in FIG. 3E; moreover, the light-shielding mechanisms 10 and 20 of the variable slit apparatus 100 are driven so that the left side slit width S increases. Thereby, the amount of exposure on the right side decreases and the amount of exposure on the left side increases, and it is therefore possible to correct exposure unevenness caused by the unevenness of the illuminance of the illumination light EL.

FIG. 3E to 3H show cases wherein the shape of the long side on one side of the illumination light EL has been modified. If modifying the shape of the long side on each side of the illumination light EL, then the slit width S is the same as the case wherein the shape of the long side on one side of the illumination light EL has been modified.

The illuminance unevenness of the illumination light EL includes a low order unevenness component (including a first order unevenness and an oblique unevenness), wherein the illuminance changes at a constant ratio from the right to the left, as in the example discussed above, as well as a high order unevenness component. The high order unevenness component includes: a second order unevenness (FIG. 3B), wherein the illuminance changes radially; a quartic curve shaped fourth-order unevenness (FIG. 3C); random unevenness (FIG. 3D), wherein the illuminance unevenness arises randomly; and the like.

Figure 3F:
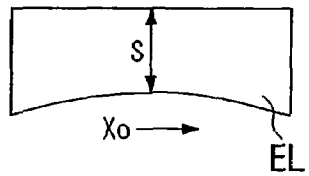
FIG. 3F illustrates the illuminance unevenness of the illumination light.
Figure 3C:
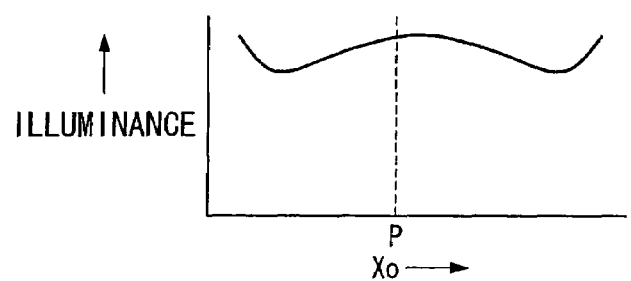
FIG. 3C illustrates the illuminance unevenness of the illumination light.
Figure 3G:
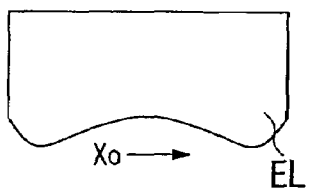
FIG. 3G illustrates the illuminance unevenness of the illumination light.
Figure 3D:
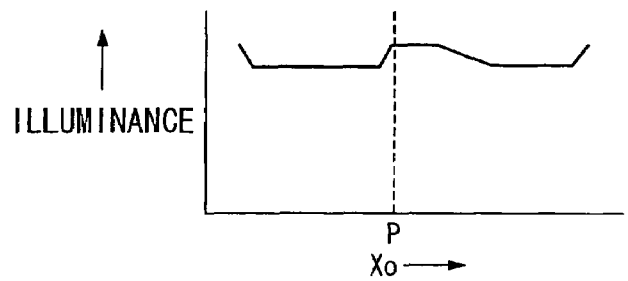
FIG. 3D illustrates the illuminance unevenness of the illumination light.
Figure 3H:
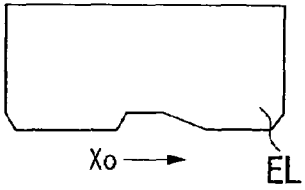
FIG. 3H illustrates the illuminance unevenness of the illumination light.

In the case of first order unevenness, it is possible to adjust the amount of exposure so that it is substantially uniformized by changing the slit width S at a constant ratio, as discussed above (FIG. 3E). In addition, in the case of second order unevenness, fourth-order unevenness, or random unevenness, the amount of exposure can be corrected by changing the slit width S, as shown in FIG. 3F and 3H, so that the amount is substantially uniformized in accordance with the distribution conditions of the illuminance, and it is therefore possible to suppress the occurrence of exposure unevenness caused by illuminance unevenness.

The following explains the specific operation of the variable slit apparatus 100 when correcting exposure unevenness caused by, for example, illuminance unevenness.

First, the amount of exposure of the illumination light EL is measured. An illuminometer 230 is provided, for example, on the stage WS that holds the wafer W, as shown in FIG. 2; furthermore, when measuring the illuminance of the illumination light EL within the exposure area, the illuminometer 230 is disposed in the vicinity of the position (image plane of the projection optical system PL) that is conjugate to the pattern of the reticle R with respect to the projection optical system PL. For example, the size of the light receiving surface of the illuminometer 230 is formed larger than the exposure area that is irradiated on the wafer W, and may measure the illuminance unevenness within the exposure area; in addition, the size of the light receiving surface of the illuminometer 230 may be formed smaller than the exposure area irradiated on the wafer W, and may be constituted so as to measure the illuminance unevenness within the exposure area by scanning therein.

Furthermore, the measurement results of the amount of exposure (illuminance unevenness), which were obtained by using the illuminometer 230, are sent to the main control system 220.

Instead of using the illuminometer 230, a test reticle, wherein a test pattern is formed, may be used in place of the reticle R, wherein a pattern of a circuit is formed, the test pattern may be exposed on the wafer W, and the line widths of the test pattern on the wafer W, which has been undergone exposure, may be actually measured in order to indirectly measure the amount of exposure. In addition, it is preferable to measure the line widths on the wafer W at a plurality of places within at least one shot region. Furthermore, it is preferable to determine the correction value of the slit width S in accordance with the position at which the illumination light EL is irradiated within the shot region.

Thus, by measuring the line widths of the test pattern actually formed on the wafer W, it is also possible to comprehensively correct line width errors due to causes other than illuminance unevenness of the illumination light EL (e.g., distribution unevenness in the resist on the wafer W and the like), as discussed later.

For example, the illuminance unevenness within the exposure area is measured when starting up the exposure apparatus, performing maintenance, or setting the exposure conditions at the time of exposing the wafer. Exposure conditions include, for example, the illumination condition (aperture stop setting) for illuminating the reticle R, the numerical aperture of the projection optical system, and the sensitivity of the resist coated on the wafer. For example, the illuminance unevenness is measured for every shot region, wafer W, or lot.

At the main control system 220, to which the measurement result of the amount of exposure was sent, the calculation unit 221 analyzes the measurement results and determines the mode of the illuminance unevenness (first order unevenness, second order unevenness, random unevenness, and the like) of the illumination light EL. Furthermore, the shape (slit width S) of the illumination light EL needed to correct the exposure unevenness caused by that illuminance unevenness is determined, and the amount of drive of each of the blades of the light-shielding mechanisms 10 and 20 needed for forming that shape is also determined.

Furthermore, based on the determined amounts of drive of the blades, the main control system 220 drives the blades of the light-shielding mechanisms 10 and 20 by instructing the variable slit apparatus 100 to drive the linear actuators 70 of the actuator units 50 and 60.

In so doing, portions of the slit width S of the illumination light EL are changed by driving the variable slit apparatus 100 in accordance with the illuminance unevenness of the illumination light EL.

In the calculation unit 221, the reason that the mode of the illuminance unevenness of the illumination light EL is determined is because the light-shielding mechanisms 10 and 20 to be driven are differentiated in accordance with that mode.

For example, if the illuminance unevenness of the illumination light EL is first order unevenness, then the main control system 220 instructs the variable slit apparatus 100 to drive only the second light-shielding mechanism 20. This is because the edge part of the blade 40 that constitutes the second light-shielding mechanism 20 is linearly formed, and it is consequently possible to linearly shield the illumination light EL just by rotating and moving the blade 40 toward the illumination light EL. It is thereby possible to reliably correct first order unevenness. In addition, because the blade 40 is driven by just its two linear actuators 70, the second light-shielding mechanism 20 can linearly shield the illumination light EL more rapidly and reliably than the first light-shielding mechanism 10, which comprises the plurality of blades 30.

In addition, if the illuminance unevenness of the illumination light EL is, for example, a high order unevenness of the second order or higher (including random), then the main control system 220 instructs the variable slit apparatus 100 to drive only the first light-shielding mechanism 10. This is because it is impossible from the standpoint of the mechanism to correct high order unevenness of the second order or higher with the second light-shielding mechanism 20, and it is therefore necessary to correct such unevenness by using the first light-shielding mechanism 10.

There are many cases where the illuminance unevenness of the illumination light EL is a compound unevenness, wherein multiple modes of unevenness are combined. Consequently, it is necessary to jointly drive both of the light-shielding mechanisms 10 and 20 so as to eliminate the illuminance unevenness. In addition, there are many cases where the compound unevenness includes first order unevenness. Consequently, it is preferable to first reliably eliminate first order unevenness using the second light-shielding mechanism 20. Furthermore, after eliminating the first order unevenness, the high order unevenness is eliminated by the first light-shielding mechanism 10. Thereby, it is possible to reliably correct unevenness even if it is compound unevenness, wherein multiple modes of unevenness are combined.

In addition, it is also possible to correct illuminance unevenness in every shot region formed on a single wafer W. In this case, before exposing the wafer, for example, the amount of push and pull of each blade 30 of the first light-shielding mechanism 10 is set so that the first light-shielding mechanism 10 corrects unevenness of a second order or higher, excluding first order unevenness. The setting of this amount of push and pull is not modified until the exposure of a single wafer or a plurality of wafers is finished. In addition, the inclination angle of the edge part of the blade 40 of the second light-shielding mechanism 20 is set so that the second light-shielding mechanism 20 corrects first order unevenness. Because the second light-shielding mechanism 20 is capable of rapid drive, the inclination angle of the edge part of the blade 40 of the second light-shielding mechanism 20 can be modified for every shot region formed on a single wafer. Accordingly, first order unevenness can be reliably corrected for every shot region.

In addition, as previously discussed, the reticle R can be illuminated under illumination conditions, such as annular, small circle, large circle, and quadrupole illumination. Accordingly, for every type of illumination condition, once the shape (slit width) of the illumination light EL has been set, that shape is stored in the main control system 220, and the light-shielding mechanisms 10 and 20 of the variable slit apparatus 100 may be driven every time the illumination condition is modified so that they form the shape of the illumination light EL. In addition, the amount by which the first light-shielding mechanism 10 and the second light-shielding mechanism 20 of the variable slit apparatus 100 are required to move in the optical axis direction of the illumination optical system 121 is stored in the main control system 220 for every type of illumination condition, and the light-shielding mechanisms 10 and 20 may be driven every time the illumination condition is modified so that the blur width of the circumferential edge part of the illumination light EL is optimized. This is because the blur width of the circumferential edge part of the slit-shaped illumination area that is irradiated on the reticle R and the wafer W changes attendant with the modification of the illumination conditions. In particular, if the blur width (width of the long sides L1, L2 of the slit-shaped illumination light EL) of the circumferential edge part in the direction (X direction) orthogonal to the scanning direction (Y direction) changes, then it becomes difficult to maintain the illuminance uniformity of the shot region in the scanning direction within the permissible range. Accordingly, in the present embodiment, the blur width of the circumferential edge part can be optimally set by moving the first light-shielding mechanism 10 and the second light-shielding mechanism 20 in the optical axis direction every time the illumination conditions are modified, as discussed above. Based on the relationship between this optimally set blur width, the amount of exposure, and the illuminance uniformity, the minimum exposure pulse count needed to expose a single shot region is determined, and the exposure pulse count needed to actually expose the shot region can be set so that it is greater than the determined minimum exposure pulse count, and it is therefore possible to accurately maintain the illuminance uniformity and the cumulative amount of exposure with respect to the wafer W.

The embodiment discussed above explains a case wherein the line widths of the pattern are uniformized by using the variable slit apparatus 100 to correct illuminance unevenness and thereby suppress exposure unevenness. However, there is also a case wherein the line widths of the pattern are uniformized by using the variable slit apparatus 100 to actively generate illuminance unevenness and thereby perform the exposure nonuniformly.

For example, if the film thickness of the photoresist coated on the wafer W is nonuniform, then an illuminance unevenness is generated in accordance with that film thickness unevenness. Furthermore, it is possible to suppress defects (nonuniformity) in the line widths of the pattern caused by unevenness in the film thickness of the photoresist by increasing the slit width S and thereby increasing the amount of exposure at the areas where the film thickness of a positive photoresist is thick, and by decreasing the slit width S in order to decrease the amount of exposure at the areas where the film thickness is thin.

The following explains the specific operation of the variable slit apparatus 100 when correcting defects (nonuniformity) in the line widths of the pattern generated by causes other than illuminance unevenness.

Prior to performing the exposure, the photoresist is coated on the wafer W. The photoresist is a photosensitive resin and has a negative type, wherein the portions irradiated by the illumination light EL from the reticle R remains, as well as a positive type, wherein the irradiated portions are removed. The photoresist is thinly coated on the front surface of the wafer W by a coater. The coater is an apparatus that creates a uniform thin film of resist on the wafer W by dripping the liquid resist, which is supplied by a nozzle, onto the front surface of the wafer W, which is fixed to a rotary support platform that is rotated at high speed.

Nevertheless, it is extremely difficult to actually form a uniform resist film on the front surface of the wafer W. The film thickness of the resist deposited on the wafer W is governed by the viscosity of the resist, the type of solvent in the resist, as well as the rotational velocity and the rotational time of the coater. In particular, due to the coating method of the resist, a resist film of nonuniform thickness is concentrically and circularly formed starting from the center of the wafer W. In other words, because of the effect of surface tension and the like at the edge part of the wafer W, the resist film thickness at the circumferential area has a tendency to become thicker than at the center area of the wafer W.

Furthermore, if the entire wafer W is exposed when the resist film thickness thereon is nonuniform, then a differential will arise on the order of the photosensitivity (photochemical reaction) of the resist between the areas where the resist film is thick and the areas where it is thin, even if the wafer W is exposed with uniform illumination light. In other words, photosensitivity will be insufficient at the areas where the resist is thick, and excessive at the areas where it is thin.

Furthermore, in the case of positive resist, the resist will not be sufficiently eliminated in areas where the photosensitivity is insufficient, and the line widths of the pattern will be decreased; on the other hand, because the resist will be eliminated more than necessary in areas where the photosensitivity is excessive, the line widths of the pattern will be increased. Accordingly, the line widths of the pattern will be decreased in the center area and increased in the circumferential area of the wafer W. In the case of a negative resist, the line widths of the pattern will be increased in the center area and decreased in the circumferential area of the wafer W.

In addition, the line widths of the pattern will also be nonuniform if the various processes of the developing and etching processes, which are performed after the exposure process, are performed nonuniformly.

The developing process dissolves and eliminates part of the resist on the wafer W, which has been undergone exposure, with an alkaline aqueous solution. In other words, because the portions of the resist on the wafer W that were irradiated (exposure processed) with the illumination light EL are photochemically changed to be soluble or insoluble in the alkaline aqueous solution, the soluble portions of the resist are dissolved and eliminated by spraying the wafer W with the alkaline aqueous solution via a spray nozzle.

There are many cases wherein the dissolving of the resist is greatly affected by the temperature and concentration of the alkaline aqueous solution, the pressure of the spray, as well as the angle and time period of the spraying, and the dissolving of the resist therefore becomes nonuniform. For example, if the alkaline aqueous solution is sprayed from the circumferential side to the center of the wafer W, then there are cases wherein the dissolving of the resist is insufficient at the center area and excessive at the circumferential area of the wafer W.

Consequently, a phenomenon occurs wherein the line widths of the pattern are decreased in the areas where the dissolving and elimination of the resist is insufficient, and are increased in areas where the dissolving is excessive.

The etching process forms a pattern by dissolving the copper foil portion of the wafer W, which was exposed by the developing process, with an oxidizing aqueous solution.

Examples of an oxidizing aqueous solution include ferric chloride solution and cupric chloride solution, and examples of methods of applying the oxidizing aqueous solution include dipping and spraying.

With dip type etching, there is a phenomenon wherein the etching proceeds from the circumference to the center of the wafer W, and the etching therefore becomes nonuniform between the center area and the circumferential area of the wafer W. Particularly, the differential between the center area and the circumferential area increases attendant with an increase in the size of the wafer W.

In addition, although the differential in the etching between the center area and the circumferential area is small when using spray etching as compared with dip type etching, the etching becomes nonuniform due to impact of the effective range of the nozzle covered by the spray nozzle, the same as the case of the developing process.

Consequently, a phenomenon occurs wherein, for example, the etching is insufficient and the line widths of the pattern increase at the center area, and the etching is excessive and the line widths of the pattern decrease at the circumferential area of the wafer W.

Figure 4A:
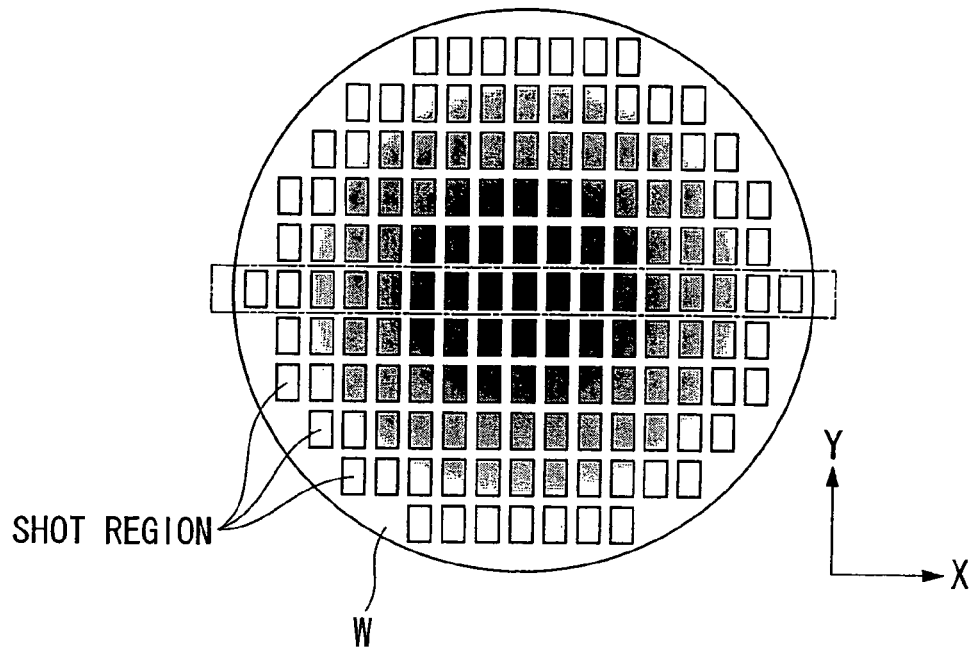
FIG. 4A schematically shows the distribution and the like of the line widths of a pattern formed on a wafer W.
Figure 4B:
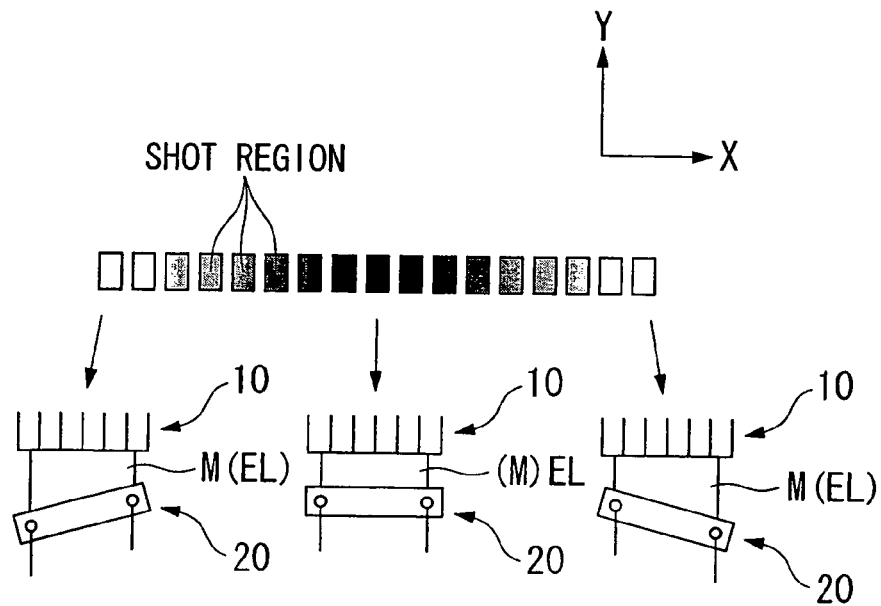
FIG. 4B schematically shows the distribution and the like of the line widths of a pattern formed on a water W.

FIG. 4A and 4B schematically show the distribution of the amount of change in the line widths of the pattern formed on the wafer W. The areas in the figure where the color is dark represent areas where the line widths are small, and the areas where the color is light represents areas where the line widths are large.

Figure 6:
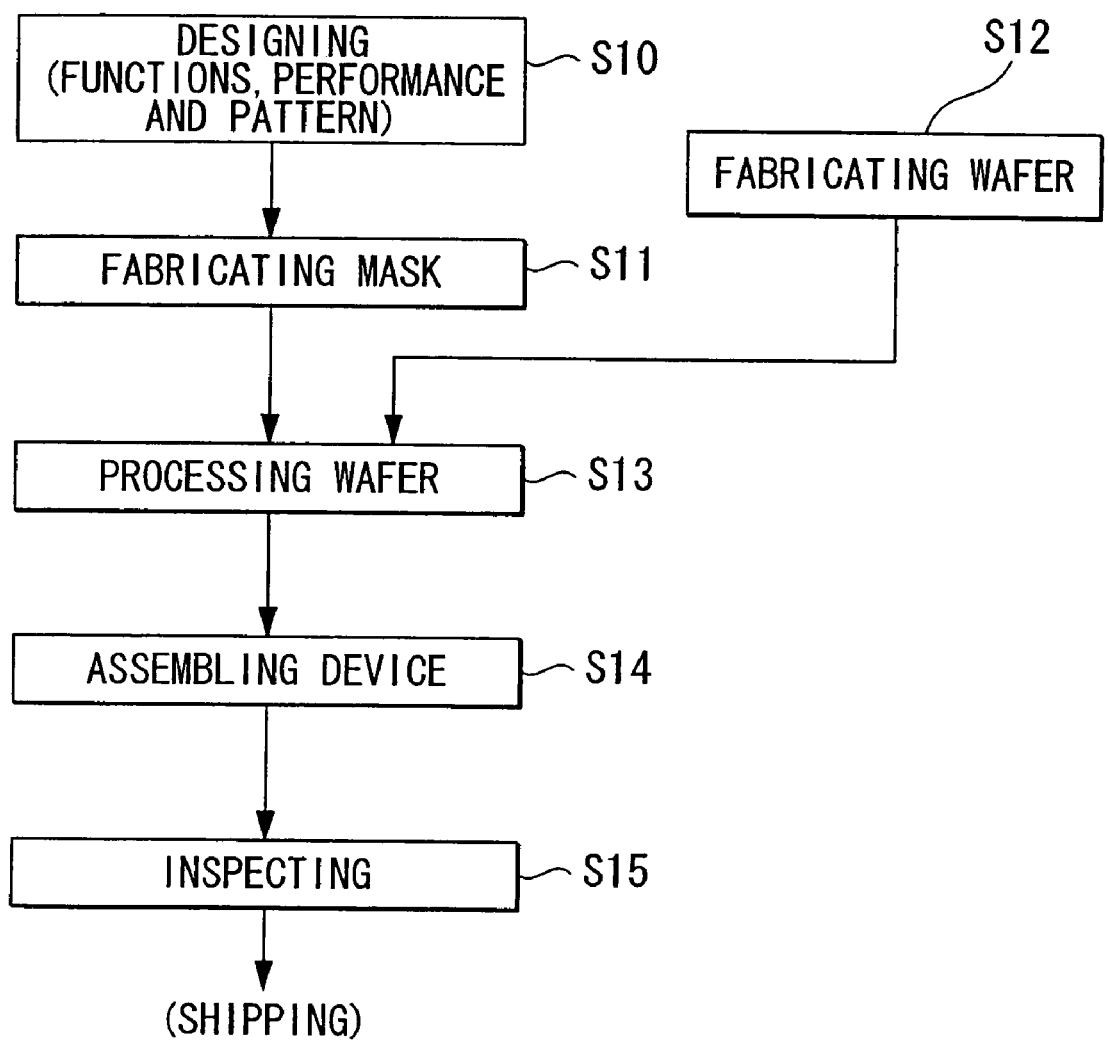
FIG. 6 depicts one example of a detailed process of step S13 in FIG. 5.

As discussed above, even if there is no unevenness in the illuminance of the illumination light EL, there are cases wherein the line widths of the pattern formed in each shot region of the wafer W are nonuniform due to the processes in a pre-processing and post-processing processes of the exposure process (refer to FIG. 6).

Even in such a case, it is possible to uniformize the line widths of the pattern by making the variable slit apparatus 100 function as described below. First, it is not easy to accurately know the causes of the nonuniformity of the line widths of the pattern, or to what extent any cause impacts the nonuniformity. However, it can be expected that the various processes in the pre-processing and post-processing processes are performed substantially uniformly at least for wafers W that are in the same lot. In other words, the film thickness of the resist and the conditions of the developing and etching processes are substantially uniform for wafers W that are in the same lot.

Accordingly, in order to examine the nonuniformity of the line widths of the pattern formed on the wafer W beforehand, a test exposure is performed using either a reticle wherein a test pattern is formed, or a reticle wherein a circuit pattern is formed, and the line widths of the pattern formed on the wafer W are then measured. In addition, before performing the test exposure, the variable slit apparatus 100 temporarily drives the first light-shielding mechanism 10 and the second light-shielding mechanism 20 so that the slit width transitions to the initial state, i.e., an equispaced slit width. In this initial state, the illuminometer 230 is used to measure the illuminance distribution in the slit-shaped exposure area irradiated upon the wafer. Subsequently, the exposure process is performed with the illumination light EL that passes through the equispaced slit width, the pattern is formed on the wafer W, and the distribution of the line widths of the pattern is measured.

Based on the illuminance distribution in the slit-shaped exposure area measured prior to the test exposure, the amount of push and pull of each of the blades 30 of the first light-shielding mechanism 10 and the amount of inclination of the blade 40 of the second light-shielding mechanism 20 needed to correct the illuminance unevenness, which is generated by changes in the transmittance of the optical elements that constitute the illumination optical system 121 and the projection optical system PL provided by the exposure apparatus, are determined.

In addition, based on the distribution of the amount of change of the line widths of the wafer W determined by the test exposure, the amount of change in the line widths that arises in every shot region on the wafer is determined. Based on the determined amount of change in the line widths, the amount of inclination of the blade 40 of the second light-shielding mechanism 20 needed to correct that amount of change in the line widths is determined for every shot region.

Furthermore, prior to the actual exposure process, the main control system 220 adjusts the amount of push and pull of each of the blades 30 of the first light-shielding mechanism 10 and the amount of inclination of the blade 40 of the second light-shielding mechanism 20 based on the measurement results of the illuminometer 230. Next, in the actual exposure process of every shot region, the incidence of line width defects in the pattern is reduced, in accordance with the results of the distribution of the line widths of the wafer W that has been test exposed, by adding the amount of inclination of the blade 40 determined for every shot region to the preadjusted amount of inclination (the amount of inclination of the blade of the second light-shielding mechanism 20 determined based on the measurement result of the illuminometer 230), thereby adjusting the cumulative amount of exposure applied to every shot region.

For example, in a shot region where the line widths of the pattern are decreased, the illuminance of the illumination light EL is reduced; on the other hand, in a shot region where the line widths of the pattern are increased, the illuminance of the illumination light EL is increased. Namely, the active generation of exposure unevenness offsets the unevenness of each of the processes in the pre-processing and post-processing processes of the exposure process.

Specifically, if the line widths of the pattern are nonuniform in one shot region as a result of the test exposure, then the variable slit apparatus 100 changes the slit width to generate exposure unevenness in order to correct the unevenness in the non-scanning direction for that shot region. On the other hand, the unevenness in the scanning direction can be corrected by performing a scanning exposure while changing the pulse count of the illumination light EL, or by performing an exposure while changing the travel velocity, i.e., the scanning speed, of the wafer stage WS.

As shown in FIG. 4B, focusing attention on the plurality of shot regions lined up in the non-scanning direction (X direction) on the wafer W, the line widths in the shot regions on the left end, for example, are large on the left side and small on the right side for those shot regions. The line widths in the center shot regions are small throughout. Furthermore, the line widths in the shot region on the right end are small on the left side and large on the right side for those shot regions.

In such a case, when successively performing exposures by stepping in the X direction, it is possible to satisfactorily reduce unevenness by changing the light-shielding mechanism 20 of the variable slit apparatus 100 for every shot region. Specifically, as shown in FIG. 4B, with the shot regions on the left end, the exposure is performed by driving the light-shielding mechanism 20 so that the slit width S of the aperture M is large on the left side and small on the right side for those shot regions. In the center shot regions, the exposure is performed uniformly with the light-shielding mechanism 20 set parallel. Furthermore, with the shot regions on the right end, the exposure is performed so that the slit width S of the aperture M is small on the left side and large on the right side for those shot regions.

The reason why the light-shielding mechanism 20 is driven is because gradually changing the line widths of the pattern along the X direction can be expected to produce significant results even though only the first order component is corrected, and because it can be driven faster than the light-shielding mechanism 10, which makes it possible to maintain high throughput of the exposure process without interrupting it.

Thus, by performing the exposure process by causing the variable slit apparatus 100 to operate on each of the shot regions on the wafer W, it is possible to suppress the situation wherein the line widths of the pattern formed in each of the shot regions of the wafer W are nonuniform due to the processes in the pre-processing and post-processing processes of the exposure process, and the line widths of the pattern are thereby uniformized.

Furthermore, focusing on the plurality of shot regions lined up in the scanning direction (Y direction) on the wafer W, the line widths of the pattern change gradually along the Y direction, and it is therefore also possible to perform the exposure process while stepping in the Y direction, without stepping in the X direction. In this case, it is possible to suppress unevenness while reducing the number of shape changes made by the light-shielding mechanism 20 by changing, for example, the travel velocity of the stages, the oscillation frequency of the laser, and the pulse energy of the laser, for every shot region. When performing the exposure process while stepping in the Y direction, it is necessary to drive the reticle stage RS, the reticle blind of the illumination optical system 121, and the like with a drive sequence that is different from the drive sequence used when stepping in the X direction. In this case, it is not necessary to drive the light-shielding mechanism 10 until the exposure of one column in the Y direction is finished.

As explained above, the variable slit apparatus 100 corrects first order unevenness and high order unevenness with different light-shielding mechanisms 10 and 20, and it is therefore possible to precisely correct illuminance unevenness without complicating the control of the plurality of light-shielding mechanisms 10 and 20. In addition, high order unevenness of the illumination light EL can be precisely corrected by finely changing the shape of the illumination light EL in the longitudinal direction. In particular, because first order unevenness of the illumination light EL can be rapidly corrected by the light-shielding mechanism 20, it is possible to accurately form a fine pattern without reducing the throughput of the exposure apparatus EX.

The use of the variable slit apparatus 100 is not limited to the case of suppressing illumination unevenness, but can also reduce the incidence of defects (nonuniformity) of the line widths of the pattern due to causes other than illumination unevenness by actively generating illumination unevenness.

The operation procedure and the combinations of various shapes of the constituent members described in the embodiments discussed above are merely exemplary, and the specific constitution is not limited to these embodiments; further, it is understood that variations and modifications based on process conditions, design requirements, and the like may be effected without departing from the spirit and scope of the invention. The present invention also includes, for example, the following modifications.

The embodiment discussed above explained a case wherein a so-called comb-type light-shielding mechanism is used by forming a plurality of blades in one light-shielding mechanism so that the blades are disposed pectinately with substantially no gaps therebetween, but the present invention is not limited thereto. A so-called chain-type light-shielding mechanism may be used, wherein a plurality of blades are formed so that they are rotatably linked at each of their ends, as disclosed in Japanese Published Unexamined Patent Application No. H10-340854.

In the embodiment discussed above, a case was explained wherein linear actuators 70 are linked to both ends of the blade 40 of the second light-shielding mechanism 20 in order to rotate the blade 40, but the present invention is not limited thereto. For example, the blade 40 may be rotated by connecting a rotary system actuator, such as a motor, to the center part thereof.

In addition, the embodiment discussed above explained a constitution wherein the second light-shielding mechanism 20 comprises one blade 40, but multiple long blades, the edge parts of which are longer than the blades of the first light-shielding mechanism 10, may be combined. For example, the present invention may be constituted by providing two, three, or four blades.

In addition to voice coil motors, it is also possible to use linear motors, rack and pinion mechanisms that use servomotors, cam mechanisms, and the like for the linear actuators.

In addition, in the embodiment discussed above, defects in the line widths of the pattern caused by unevenness in the film thickness of the resist was verified based on the distribution of the line widths of the test pattern formed on the wafer. Nevertheless, the present invention is not limited to this embodiment. For example, the relationship between the film thickness of the resist and defects in the line widths of the pattern may be determined in advance by, for example, pretesting and simulation, the film thickness of the resist may be detected by a film thickness measuring apparatus, and defects in the line widths of the pattern may be verified based on those detection results.

The application of the exposure apparatus is not limited to an exposure apparatus for fabricating semiconductor devices, but may be widely adapted to, for example, an exposure apparatus for liquid crystal devices that exposes the pattern of a liquid crystal display device on a square glass plate, an exposure apparatus for fabricating thin film magnetic heads, and the like.

In addition, a KrF excimer laser (248 nm), an ArF excimer laser (193 nm), an $F_2$ laser (157 nm), as well as a g-line (436 nm) and i-line (365 nm) light source can be used as the light source of the exposure apparatus wherein the present invention is adapted. Furthermore, the magnification of the projection optical system is not limited to a reduction system, but may also be a unity magnification system or an enlargement system.

If using linear motors in the wafer stage, the reticle stage, and the like, then either an air levitation type that uses an air bearing or a magnetic levitation type that uses Lorentz's force or the reactance force may be used. In addition, the stage may be a type that moves along a guide, or a guideless type. Furthermore, if a planar motor is used as the drive apparatus of the stage, then either the magnet unit (permanent magnet) or the armature unit is connected to the stage, and the other one is connected to the moving surface side (base) of the stage.

The reaction force generated by the movement of the wafer stage may be mechanically released to the floor (ground) using a frame member, as recited in Japanese Published Unexamined Patent Application No. H8-166475.

The reaction force generated by the movement of the reticle stage may be mechanically released to the floor (ground) using a frame member, as disclosed in Japanese Published Unexamined Patent Application No. H8-330224.

In addition, the exposure apparatus, wherein the present invention is adapted, is manufactured by assembling various subsystems, including each constituent element recited in the claims of the present application, so that prescribed mechanical, electrical, and optical accuracies are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus from the various subsystems includes the mutual mechanical connection of the various subsystems, the wiring and connection of electrical circuits, the piping and connection of the atmospheric pressure circuit, and the like. Naturally, before the process of assembling the exposure apparatus from these various subsystems, there are also the processes of assembling each individual subsystem. When the process of assembling the exposure apparatus from the various subsystems is finished, a comprehensive adjustment is performed to ensure the various accuracies of the exposure apparatus as a whole. It is preferable to manufacture the exposure apparatus in a clean room wherein the temperature, the cleanliness level, and the like are controlled.

The following explains an embodiment of a process of fabricating microdevices using the exposure apparatus and the exposure method according to the embodiments of the present invention in a lithographic process. FIG. 6 depicts a flow chart of an example of fabricating a microdevice (a semiconductor chip like an IC or an LSI, a liquid crystal panel, a CCD, a thin film magnetic head, a micromachine, and the like).

First, in step S10 (designing step), the functions and performance of the microdevice (e.g., the circuit design of the semiconductor device), as well as the pattern for implementing those functions, are designed. Continuing, in step S11 (mask fabrication step), the mask (reticle), wherein the designed circuit pattern is formed, is fabricated. Moreover, in step S12 (wafer fabricating step), the wafer is fabricated using a material, such as silicon.

Next, in step S13 (wafer processing step), the actual circuit and the like are formed on the wafer by, for example, lithographic technology, as discussed later, using the mask and the wafer that were prepared in step S10-S12. Continuing, in step S14 (device assembling step), the device is assembled using the wafer that was processed in step S13. In step S14, processes are included as needed, such as the dicing, bonding, and packaging (chip encapsulation) processes. Lastly, in step S15 (inspecting step), inspections are performed, such as an operation verification test and a durability test of the microdevice fabricated by step S14. After such processes are finished, the microdevice is completed and then shipped.

Figure 5:
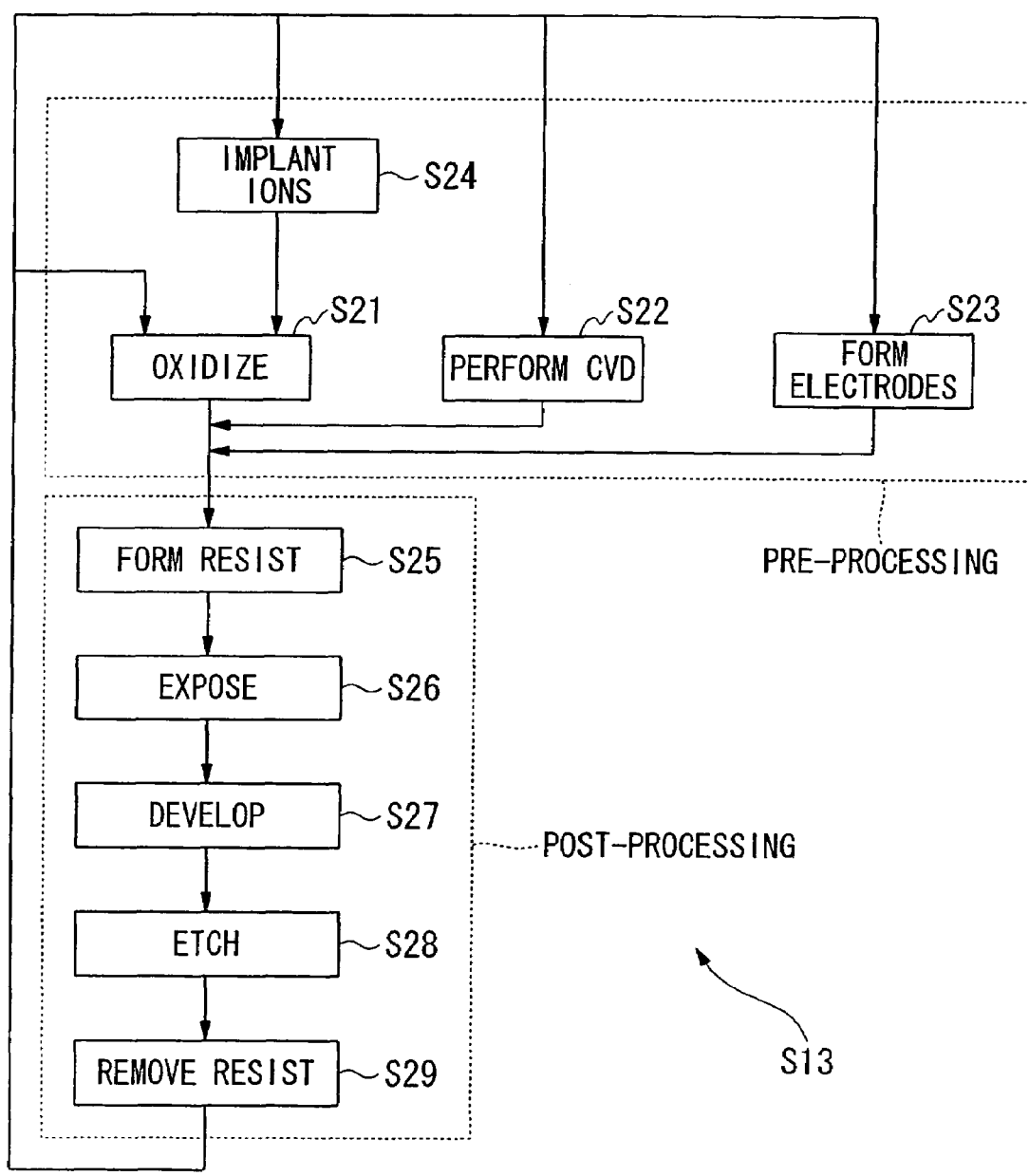
FIG. 5 is a flow chart diagram that depicts one example of a process for fabricating a microdevice.

FIG. 5 depicts one example of the detailed process of step S13 for the case of a semiconductor device.

In step S21 (oxidizing step), the front surface of the wafer is oxidized. In step S22 (CVD step), an insulating film is formed on the front surface of the wafer. In step S23 (electrode forming step), an electrode is formed on the wafer by vacuum deposition. In step S24 (ion implanting step), ions are implanted in the wafer. The above steps S21-S24 constitute the pre-processing processes of the various stages of wafer processing and are selectively performed in accordance with the processes needed in the various stages.

In the various stages of wafer processing, when the pre-processing processes discussed above are finished, the post-processing processes are performed as described below. In the post-processing processes, the wafer is first coated with a photosensitive agent in step S25 (resist forming step). Continuing, in step S26 (exposing step), the circuit pattern of the mask is transferred onto the wafer by the lithography system (exposure apparatus) and exposure method explained above. Next, in step S27 (developing step), the exposed wafer is developed; further, in step S28 (etching step), the uncovered member portions are removed by etching, excluding the portions where the resist remains. Further, in step S29 (resist removing step), etching is finished and the resist that is no longer needed is removed. Circuit patterns are superimposingly formed on the wafer by repetitively performing the pre-processing and post-processing processes.

In addition to fabricating microdevices like semiconductor devices, the present invention can also be adapted to an exposure apparatus that transfers a circuit pattern from a mother reticle to a glass substrate, a silicon wafer, and the like in order to fabricate a reticle or a mask used by a exposure apparatus, an EUV exposure apparatus, an X ray exposure apparatus, an electron beam exposure apparatus, and the like. Here, a light transmitting type reticle is generally used in an exposure apparatus that uses DUV (deep ultraviolet) light, VUV (vacuum ultraviolet) light, and the like; in addition, quartz glass, quartz glass doped with fluorine, fluorite, magnesium fluoride, crystal, and the like are used for the reticle substrate. In addition, a light transmitting type mask (a stencil mask or a membrane mask) is used with a proximity type X ray exposure apparatus, an electron beam exposure apparatus, and the like, and a silicon wafer and the like is used for the mask substrate. An exposure apparatus is disclosed in PCT International Publication WO99/34255, PCT International Publication WO99/50712, PCT International Publication WO99/66370, Japanese Published Unexamined Patent Application No. H11-194479, Japanese Published Unexamined Patent Application No. 2000-12453, Japanese Published Unexamined Patent Application No. 2000-29202, and the like.

Furthermore, the present invention can be adapted to a liquid immersion type exposure apparatus, wherein a liquid (e.g., pure water and the like) is filled between the projection optical system PL and the wafer, as disclosed in, for example, PCT International Publication WO 99/49504. The liquid immersion exposure apparatus may be a scanning exposure system that uses a catadioptric type projection optical system.

What is claimed is:

1. An illumination apparatus that irradiates an object to be illuminated with a slit-shaped illumination light, comprising:
a first light-shielding mechanism that comprises a plurality of edge parts that defines one long side of the illumination light;
a second light-shielding mechanism that comprises one or more edge parts that define another long side of the illumination light, the number of the one or more edge parts being less than that of the edge parts of the first light-shielding mechanism;
a first drive mechanism that drives the first light-shielding mechanism to change positions of the edge parts of the first light-shielding mechanism;
a second drive mechanism that drives the second light-shielding mechanism to change position or positions of the one or more edge parts of the second light-shielding mechanism; and
a control unit that provides the first drive mechanism with a drive command based on a first parameter in the parameters related to an illuminance unevenness of the illumination light to drive the first light-shielding mechanism and that provides the second drive mechanism with a drive command based on a second parameter in the parameters related to the illuminance unevenness to drive the second light-shielding mechanism.

2. The illumination apparatus according to claim 1, wherein the first drive mechanism comprises a first push-and-pull member that pushes and pulls the plurality of edge parts in a direction substantially orthogonal to the longitudinal direction of the illumination light.

3. The illumination apparatus according to claim 2, wherein the plurality of edge parts are pectinately disposed with substantially no gaps therebetween.

4. The illumination apparatus according to claim 1, wherein the second light-shielding mechanism comprises one blade, which comprises the one or more edge parts, and a second push-and-pull member that pushes and pulls both ends of the blade.

5. The illumination apparatus according to claim 1, wherein the first drive mechanism moves the first light-shielding mechanism in the optical path direction of the illumination light, and the second drive mechanism moves the second light-shielding mechanism in the optical path direction of the illumination light.

6. An exposure apparatus, comprising:
a controller configured to perform relative scanning of a mask having a pattern and a substrate in a direction substantially orthogonal to the longitudinal direction of a slit-shaped illumination light while irradiating the substrate with the illumination light via the mask,
wherein the illumination apparatus according to claim 1 is used as the illumination apparatus that irradiates the mask with the illumination light.

7. The exposure apparatus according to claim 6, further comprising:
a measuring unit that measures parameters related to the illuminance unevenness of the illumination light; and
a calculation unit that determines the first parameter and the second parameter based on parameters related to the illuminance unevenness so that the illuminance of the illumination light in the direction substantially orthogonal to the longitudinal direction of the illumination light during the relative motion is substantially uniform on a cumulative basis, wherein
the control unit provides the first drive mechanism and the second drive mechanism with drive commands based on a calculation result of the calculation unit.

8. The exposure apparatus according to claim 7, wherein the first parameter comprises a high order unevenness component in the illuminance distribution of the illumination light in the longitudinal direction; and the second parameter comprises a low order unevenness component in the illuminance distribution of the illumination light in the longitudinal direction.

9. The exposure apparatus according to claim 6, further comprising:
a measuring unit that measures parameters related to the illuminance unevenness of the illumination light, wherein
based on the parameters related to the illuminance unevenness and on information related to a line width of the pattern formed on the substrate, the control unit provides the first drive mechanism with a drive command to drive the first light-shielding mechanism and provides the second drive mechanism with a drive command to drive the second light-shielding mechanism.

10. The exposure apparatus according to claim 9, wherein the information related to the line width of the pattern formed on the substrate includes an amount of change in the line width that is caused by unevenness in a film thickness of a photosensitive agent coated on the substrate.

11. The exposure apparatus according to claim 6, further comprising:
a measuring unit that measures parameters related to the illuminance unevenness of the illumination light; and
a calculation unit that determines the shape of either one long side or the other long side of the illumination light based on parameters related to the line width of the pattern formed on the substrate and parameters related to the illuminance unevenness of the illumination light, wherein
based on a calculation result of the calculation unit, the control unit provides the first drive mechanism with a drive command to drive the first light-shielding mechanism and provides the second drive mechanism with a drive command to drive the second light-shielding mechanism.

12. The exposure apparatus according to claim 11, wherein the measuring unit measures parameters related to the illuminance unevenness of the illumination light when the mask is exchanged; and
before exposing the substrate with the pattern formed on the exchanged mask, the control unit provides the first drive mechanism and the second drive mechanism with drive commands based on the first parameter and the second parameter to drive the first light-shielding mechanism and the second light-shielding mechanism; and, while exposure of the pattern on each of the plurality of exposure areas on the substrate, provides the second drive mechanism with a drive command based on information related to a line width of the pattern to drive the second light-shielding mechanism.

13. The exposure apparatus according to claim 6, further comprising a control unit that provides the first drive mechanism and the second drive mechanism with a drive command that drives at least one of the first light-shielding mechanism and the second light-shielding mechanism to reduce a defect in a line width of the pattern formed on the substrate.

14. The exposure apparatus according to claim 13, wherein the defect in the line width of the pattern is caused by a pre-processing process on the substrate.

15. The exposure apparatus according to claim 13, wherein the defect in the line width of the pattern is caused by a post-processing process on the substrate.

16. An exposure method that performs relative scanning of a mask having a pattern and a substrate in a direction substantially orthogonal to the longitudinal direction of a slit-shaped illumination light while irradiating the substrate with the illumination light via the mask, the method comprising:
measuring parameters related to an illuminance unevenness of the illumination light;
changing the shape of the illumination light in the longitudinal direction, the change comprising:
changing positions of a plurality of edge parts of a first light-shielding mechanism based on a first parameter in the parameters related to the illuminance unevenness to define one long side of the illumination light, and
changing position of one edge part or positions of a plurality of edge parts of a second light-shielding mechanism based on a second parameter in the parameters related to the illuminance unevenness to define another long side of the illumination light, the number of the one or more edge parts being less than that of the edge parts of the first light-shielding mechanism.

17. The exposure method according to claim 16, further comprising:
calculating the first parameter and the second parameter based on the parameters related to the illuminance unevenness so that the illuminance of the illumination light in the direction substantially orthogonal to the longitudinal direction of the illumination light during the relative motion is substantially uniform on a cumulative basis; and
driving the first light-shielding mechanism and the second light-shielding mechanism based on a calculation result.

18. The exposure method according to claim 16, further comprising:
calculating at least either the shape of the other long side of the illumination light based on the parameters related to the illuminance unevenness and on information related to line widths of the pattern formed on the substrate; and
driving the second light-shielding mechanism based on a calculation result.

19. The exposure method according to claim 18, further comprising:
measuring parameters related to the illuminance unevenness of the illumination light when the mask is exchanged;
before exposing the substrate with the pattern formed on the exchanged mask, driving the first light-shielding mechanism and the second light-shielding mechanism based on a measurement result; and
driving the second light-shielding mechanism based on the information related to the line width of the pattern while exposure of the pattern upon each of the plurality of exposure areas on the substrate.

20. The exposure method according to claim 16, wherein parameters related to the line width of the pattern formed on the substrate includes an amount of change in the line width that is caused by unevenness in a film thickness of a photosensitive agent coated on the substrate.

21. The exposure method according to claim 16, wherein the first parameter comprises a high order unevenness component in the illuminance distribution of the illumination light in the long side direction; and
the second parameter comprises a low order unevenness component in the illuminance distribution of the illumination light in the longitudinal direction.

22. The exposure method according to claim 16, further comprising driving at least one of the first light-shielding mechanism and the second light-shielding mechanism to reduce a defect in a line width of the pattern formed on the substrate.

23. The exposure method according to claim 22, wherein the defect in the line width of the pattern is caused by a pre-processing process on the substrate.

24. The exposure method according to claim 22, wherein the defect in the line width of the pattern is caused by a post-processing process on the substrate.

25. A device fabrication method that includes a lithographic process, comprising:
using the exposure method according to claim 16 in the lithographic process.

26. An exposure apparatus that performs a relative movement between a mask and a substrate in a direction substantially orthogonal to the longitudinal direction of a slit-shaped illumination light while irradiating the substrate with the illumination light via the mask to expose the substrate with a pattern formed on the mask, the exposure apparatus comprising:
a first light-shielding mechanism that comprises a plurality of edge parts that define one long side of the illumination light;
a second light-shielding mechanism that comprises one or more edge parts that define another long side of the illumination light, the number of the one or more edge parts being less than that of the edge parts of the first light-shielding mechanism;
a first drive mechanism that drives the first light-shielding mechanism to displace the edge parts of the first light-shielding mechanism;
a second drive mechanism that drives the second light-shielding mechanism to displace the one or more edge parts of the second light-shielding mechanism; and
a control unit that provides the first drive mechanism with a drive command to drive the first light-shielding mechanism and that provides the second drive mechanism with a drive command to drive the second light-shielding mechanism, based on information related to a line width of the pattern formed on the substrate.

27. The exposure apparatus according to claim 26, wherein the information related to the line width of the pattern formed on the substrate comprises a variation in the line width due to film thickness unevenness of a photosensitive material coated on the substrate.

28. The exposure apparatus according to claim 26, further comprising:
a calculation unit that determines the shape of either one long side or the other long side of the illumination light based on parameters related to the line width of the pattern formed on the substrate and parameters related to the illuminance unevenness of the illumination light, wherein,
based on a calculation result of the calculation unit, the control unit provides the first drive mechanism with a drive command to drive the first light-shielding mechanism and provides the second drive mechanism with a drive command to drive the second light-shielding mechanism.

29. The exposure apparatus according to claim 26, wherein the variation in the line widths is due to a process in a pre-processing for the substrate.

30. The exposure apparatus according to claim 26, wherein the variation in the line width is due to a process in a post-processing for the substrate.

31. An exposure method that performs a relative movement between a mask and a substrate in a direction substantially orthogonal to the longitudinal direction of a slit-shaped illumination light while irradiating the substrate with the illumination light via the mask to expose the substrate with a pattern formed on the mask, the method comprising:
displacing a plurality of edge parts of a first light-shielding mechanism based on information related to a line width of the pattern formed on the substrate to define one long side of the illumination light; and
displacing one edge part or a plurality of edge parts of a second light-shielding mechanism based on information related to the line width of the pattern to define another long side of the illumination light, the number of the one or more edge parts being less than that of the edge parts of the first light-shielding mechanism.

32. The exposure method according to claim 31, wherein the information related to the line width of the pattern formed on the substrate comprises a variation in the line width due to film thickness unevenness of a photosensitive material coated on the substrate.

33. The exposure method according to claim 31, further comprising:

determining the shape of either one long side or the other long side of the illumination light based on parameters related to the illuminance unevenness of the illumination light and on information related to the line width of the pattern; and driving the first light-shielding mechanism and the second light-shielding mechanism based on a result of the determination.

34. A device fabrication method that includes a lithographic process, comprising:

using the exposure method according to claim 31 in the lithographic process.

* * * * *